(12) United States Patent
Jing et al.

(10) Patent No.: US 6,741,468 B2
(45) Date of Patent: May 25, 2004

(54) HEAT DISSIPATING ASSEMBLY

(75) Inventors: Cheng-Du Jing, Tu-chen (TW); Ching Huan Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/233,026

(22) Filed: Aug. 31, 2002

(65) Prior Publication Data

US 2004/0017659 A1 Jan. 29, 2004

(30) Foreign Application Priority Data

Jul. 26, 2002 (CN) ........................... 91211454 U

(51) Int. Cl.$^7$ ................................. H05K 7/20
(52) U.S. Cl. ............... 361/700; 165/104.33; 165/80.3; 165/151; 165/179; 165/181; 165/182; 361/690; 361/703; 257/722
(58) Field of Search ............... 165/80.2, 185, 165/104.33, 104.34, 104.32, 151, 179–184; 257/714, 722; 361/690, 694–697, 700–703, 715

(56) References Cited

U.S. PATENT DOCUMENTS

| 3,780,797 A | * | 12/1973 | Gebelius ................ 165/151 |
| 4,984,626 A | * | 1/1991 | Esformes et al. ........... 165/151 |
| 5,628,362 A | * | 5/1997 | Rew et al. ............... 165/151 |
| 5,794,684 A | * | 8/1998 | Jacoby ................ 165/80.3 |
| 6,550,529 B1 | * | 4/2003 | Horng et al. ............ 165/80.3 |

* cited by examiner

Primary Examiner—Gregory D. Thompson
(74) Attorney, Agent, or Firm—Wei Te Chung

(57) ABSTRACT

A heat dissipating assembly (1) includes a plurality of fins (10), three heat pipes (20), and a base (30). Each fin defines three through holes (11) across a middle portion thereof. A plurality of dome-shaped protruding portions (14) is formed in each fin. The protruding portions are arranged in a regular array of offset rows. Adjacent protruding portions in any row protrude from front and rear faces of the fin in a regular alternating configuration. One end of each heat pipe is respectively inserted into the corresponding through holes of the fins, and an opposite end of each heat pipe is attached in the base. The base is attached on an electronic device, for absorbing heat produced by the electronic device. The protruding portions increase a heat dissipating surface area of the fins, and deflect airflow that passes across the fins in a direction parallel to the fins.

17 Claims, 2 Drawing Sheets

HEAT DISSIPATING ASSEMBLY

BACKGROUND OF THE INVENTION

1. Field of the Invention

The present invention relates to heat dissipating assemblies, and particularly to a heat dissipating assembly with a plurality of fins configured to have a large heat dissipating surface area.

2. Description of Related Art

Developments in today's highly information-intensive society have led to remarkable improvements in performances of electronic devices. During operation of many contemporary electronic devices such as central processing units (CPUs), large amounts of heat are produced. Such heat must be quickly removed from the electronic device, to prevent the system from becoming unstable or being damaged. Typically, a heat dissipating assembly is attached to an outer surface of the electronic device to remove heat therefrom.

An example of a conventional heat dissipating assembly comprises a plurality of parallel fins, a heat pipe, and a base. Each fin defines a through hole. One end of the heat pipe is respectively inserted into the through holes of the fins. And opposite end of the heat pipe is attached on the base. The base is attached on an electronic device, for absorbing heat produced by the electronic device. The heat is transferred to the fins by the heat pipe, and dissipated from the fins. However, the fins are typically planar, which limits their heat dissipating surface area. Furthermore, airflow passing across the fins in a direction parallel to the fins cannot easily receive heat from the fins. These limitations can significantly reduce the heat dissipating efficiency of the heat dissipating assembly.

An improved heat dissipating assembly for removing heat produced by an electronic device which overcomes the above-mentioned problems is desired.

BRIEF SUMMARY OF THE INVENTION

Accordingly, an object of the present invention is to provide a heat dissipating assembly which can efficiently dissipate heat produced by an electronic device.

Another object of the present invention is to provide a heat dissipating assembly having a plurality of fins configured to increase a heat dissipating surface area thereof and to provide deflection of airflow.

To achieve the above-mentioned objects, a heat dissipating assembly in accordance with a preferred embodiment of the present invention comprises a plurality of fins, three heat pipes, and a base. Each fin defines three through holes across a middle portion thereof. A plurality of dome-shaped protruding portions is formed in each fin at opposite sides of the through holes. Some of the protruding portions protrude from a front face of the fin, and some from a rear face of the fin. The protruding portions are arranged in a regular array of offset rows. Adjacent protruding portions in any row protrude from the front face and from the rear face in a regular alternating configuration. One end of each heat pipe is respectively inserted into the corresponding through holes of the fins, and an opposite end of each heat pipe is attached in the base. The base is attached on an electronic device, for absorbing heat produced by the electronic device. The heat is transferred to the fins by the heat pipe, and dissipated from the fins. The protruding portions increase a heat dissipating surface area of the fins, and deflect airflow that passes across the fins in a direction parallel to the fins.

Other objects, advantages and novel features of the present invention will become more apparent from the following detailed description when taken in conjunction with the accompanying drawings, in which:

DETAILED DESCRIPTION OF THE INVENTION

Figure 2:
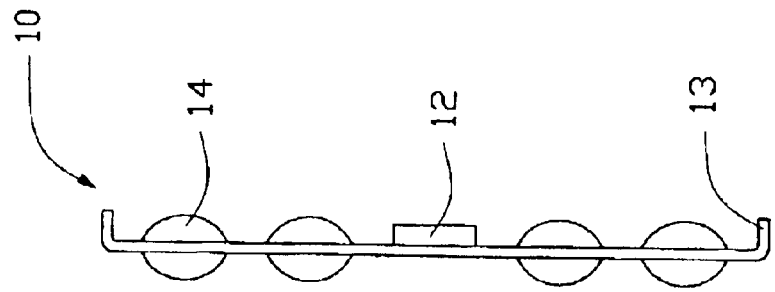
FIG. 2 is a side elevation view of the fin of FIG. 1.
Figure 1:
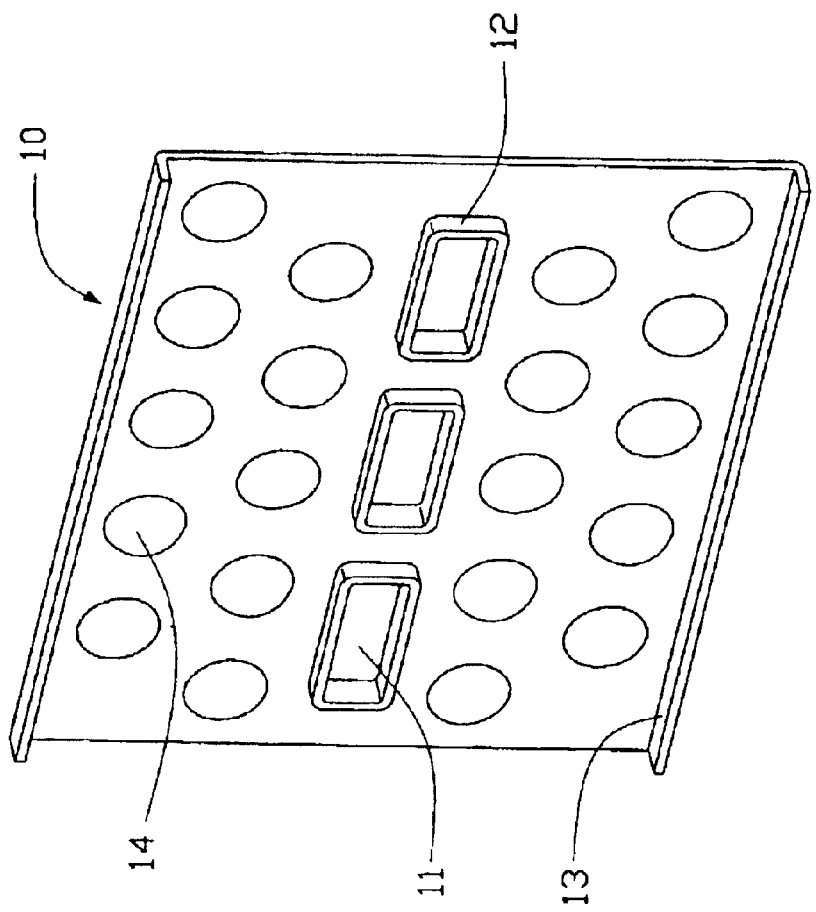
FIG. 1 is an isometric view of a fin for a heat dissipating assembly in accordance with a preferred embodiment of the present invention.
Figure 3:
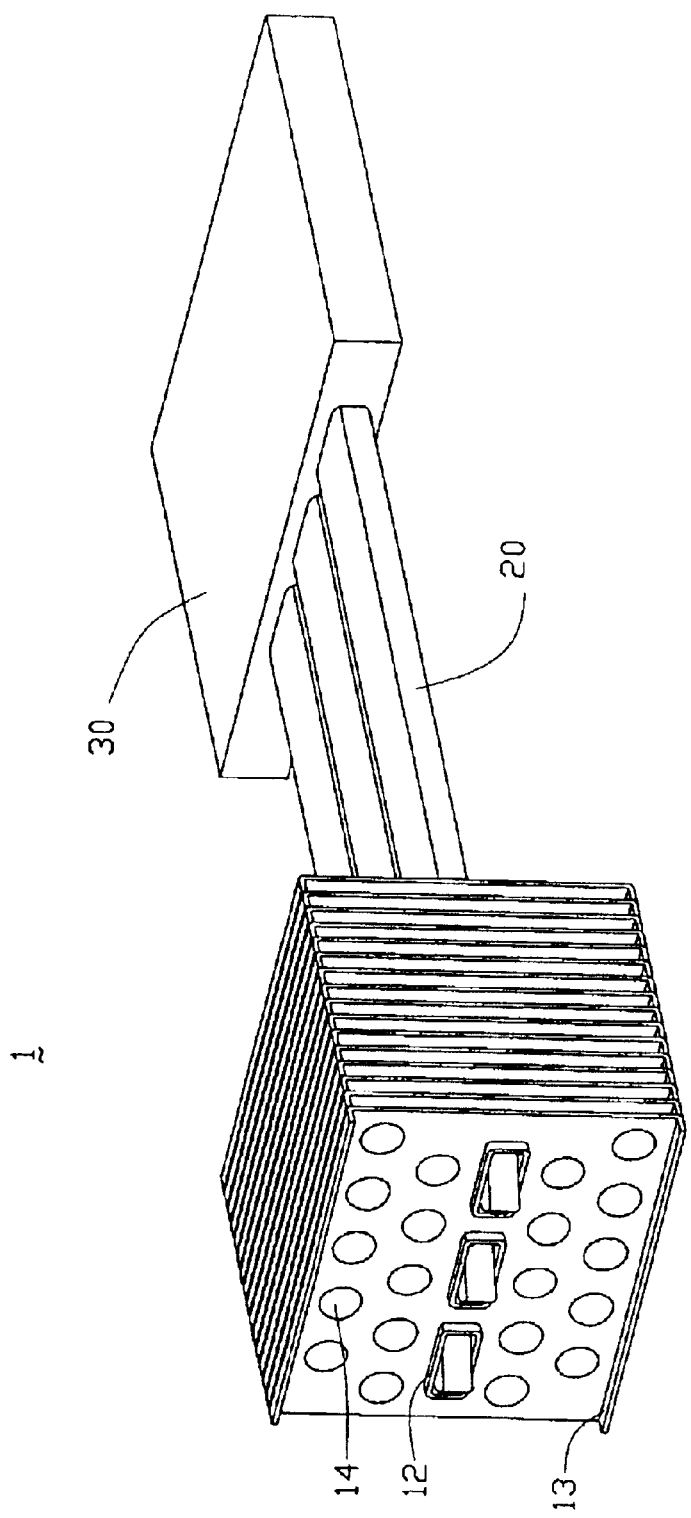
FIG. 3 is an isometric view of a heat dissipating assembly in accordance with a preferred embodiment of the present invention, incorporating a plurality of fins of FIG. 1.

Referring to FIGS. 1 to 3, a heat dissipating assembly 1 in accordance with a preferred embodiment of the present invention comprises a plurality of parallel fins 10, three heat pipes 20, and a base 30. The heat dissipating assembly 1 is attached to an electronic device (not shown), for dissipating heat produced by the electronic device.

Each fin 10 defines three aligned through holes 11 across a middle portion thereof. A contacting portion 12 is formed on a front face of the fin 10 around a periphery of each through hole 11. The contacting portions 12 are dimensioned such that they can abut outer walls of corresponding heat pipes 20, thereby increasing a contact area between the fin 10 and the heat pipes 20. Two flanges 13 are perpendicularly bent in a same direction from opposite sides of the fin 10 respectively. The flanges 13 are disposed at the front face of the fin 10. A plurality of dome-shaped protruding portions 14 is formed in the fin 10 at opposite sides of the through holes 11. Some of the protruding portions 14 protrude from the front face, and some from the rear face. The protruding portions 14 are arranged in a regular array of offset rows. Adjacent protruding portions 14 in any row protrude from the front face and from the rear face in a regular alternating configuration.

In assembly, the fins 10 are stacked together. Except for one endmost fin 10, the contacting portions 12 of each fin 10 abut a rear face of an adjacent fin 10. Except for the endmost fin 10, the flanges 13 of each fin 10 abut the rear face of the adjacent fin 10. The contacting portions 12 and flanges 13 ensure that a distance is maintained between adjacent fins 10. The fins 10 thereby cooperatively form a housing (not labeled), and two open faces (not labeled) are thereby defined in opposite sides of the housing respectively. One end of each heat pipe 20 is respectively inserted into the corresponding aligned through holes 11 of the fins 10 of the housing. An opposite end of each heat pipe 20 is attached in the base 30. The base 30 is attached on the electronic device (not shown), for absorbing heat produced by the electronic device.

In operation, the heat is transferred to the fins 10 by the heat pipe 20, and dissipated from the fins 10. The protruding portions 14 increase a heat dissipating surface area of the fins 10, and deflect airflow between the open faces of the housing. When cooling airflow flows through the housing from one open face to the opposite open face and is deflected by the protruding portions 14, heat transferring from the fins 10 to the airflow is increased. These features increase a heat dissipating efficiency of the heat dissipating assembly 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating assembly for dissipating heat from an electronic device, the heat dissipating assembly comprising:
   a base adapted to be attached on the electronic device;
   at least one heat pipe with one end thereof attached to the base; and
   a plurality of parallel fins abuttingly surrounding an opposite end of the at least one heat pipe; wherein
   each of the fins has a plurality of protruding portions arranged in a regular array of rows, and adjacent protruding portions in any row protrude from the first face and from the second face in a regular alternating configuration.

2. The heat dissipating assembly as described in claim 1, wherein each of the fins defines at least one rectangular through hole receiving said opposite end of the at least one heat pipe.

3. The heat dissipating assembly as described in claim 2, wherein at least one contacting portion is formed on the first face of each of the fins around a periphery of the at least one through hole.

4. The heat dissipating assembly as described in claim 3, wherein the at least one contacting portion is dimensioned such that it can abut an outer wall of the at least one heat pipe, whereby a contact area between the fins and the at least one heat pipe is increased.

5. The heat dissipating assembly as described in claim 4, wherein the contacting portions of the fins can provide support between adjacent fins for ensuring that a distance is maintained between the adjacent fins.

6. The heat dissipating assembly as described in claim 1, wherein two flanges extend in a same direction from opposite sides respectively of each of the fins.

7. The heat dissipating assembly as described in claim 6, wherein the flanges are disposed at the first face of each of the fins.

8. The heat dissipating assembly as described in claim 7, wherein the flanges of each of fins are dimensioned to abut the second face of an adjacent fin.

9. A planar heat dissipating fin comprising a plurality of protruding portions respectively protruding from a first face of the fin and from a second face of the fin, wherein the protruding portions arranged in a regular array of rows, adjacent protruding portions in any row protruding from the first face and from the second face in a regular alternating configuration.

10. The heat dissipating fin as described in claim 9, wherein the fin defines at least one through hole in a middle portion thereof.

11. The heat dissipating fin as described in claim 10 wherein at least one contacting portion is formed on the first face of each of the fins around a periphery of the at least one through hole.

12. The heat dissipating assembly as described in claim 9, wherein two flanges extend in a same direction from respective opposite sides the fin.

13. The heat dissipating assembly as described in claim 12, wherein the flanges are disposed at the first face of each of the fin.

14. A heat dissipating assembly comprising:
    a base adapted to be attached on the electronic device;
    a plurality of parallel fins thermally connected to said base;
    an air path defined between every adjacent two fins;
    each of said parallel fins including thereon a plurality of protruding portions arranged in rows along a direction of the air path, where convexes and concaves are formed on two opposite sides of each of said parallel fins; wherein
    said convexes and said concaves are alternatively formed in each of said rows along said direction of the air path, and the air path experiences turbulence by said protrusions formed on the two corresponding fins by two sides thereof.

15. The assembly as described in claim 14, wherein said fins are thermally connected to the base via heat pipes.

16. A fin for use in a dissipating device in a plural parallel manner with others, including a metal main plate with a flange at one edge for cooperating with another flange of another adjacent fin for keeping space therebetween, and a plurality of rows of protruding portions being formed on the main plate each with defining a convex and a concave on two opposite surfaces thereof, adjacent protruding portions in any row protruding from the first face and from the second face in a regular alternating configuration.

17. The assembly as described in claim 14, wherein adjacent protruding portions in any row protrude from the first face and from the second face in a regular alternating configuration.

* * * * *